(12) United States Patent
Seto et al.

(10) Patent No.: US 6,388,310 B1
(45) Date of Patent: *May 14, 2002

(54) SEMICONDUCTOR DEVICE WITH A PASSIVATION FILM

(75) Inventors: Hiroyuki Seto; Shogo Yoshida, both of Shiga-ken (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/921,199

(22) Filed: Aug. 27, 1997

(30) Foreign Application Priority Data

Sep. 2, 1996 (JP) .............................. 8-231535
Sep. 2, 1996 (JP) .............................. 8-231536

(51) Int. Cl.$^7$ .............................. H01L 23/58
(52) U.S. Cl. .................. 257/640; 257/637; 257/639; 257/649
(58) Field of Search ................ 257/637, 639, 257/640, 649; 438/769, 775, 786, 791

(56) References Cited

U.S. PATENT DOCUMENTS 4,097,889 A * 6/1978 Kern et al. ................... 357/54
4,621,277 A * 11/1986 Ito et al. ...................... 257/313
4,907,064 A * 3/1990 Yamazaki et al. ........... 257/639
4,959,705 A * 9/1990 Lemnios et al. ............. 257/276
5,661,344 A * 8/1997 Havemann et al. .......... 257/637
5,686,329 A * 11/1997 Chang et al. ................ 438/304
5,710,067 A * 1/1998 Foote et al. ................. 257/632
5,869,396 A * 2/1999 Pan et al. .................... 438/647

FOREIGN PATENT DOCUMENTS

| JP | 1-228135 | 9/1989 |
| JP | 3-268430 A | 11/1991 |
| JP | 6-45316 | 2/1994 |

* cited by examiner

Primary Examiner—Tom Thomas
Assistant Examiner—Ori Nadav
(74) Attorney, Agent, or Firm—Ostrolenk, Faber, Gerb & Soffen, LLP

(57) ABSTRACT

The invention provides a semiconductor device with a passivation film provided on a surface thereof, said passivation film comprising a SiON layer in contact with the surface of said semiconductor device, and a $Si_3N_4$ layer provided at the outer side of said SiON layer, chraracterized in that said passivation film has an outermost layer of $Si_3N_4$ and said outermost layer has a portion in contact with said semiconductor device or the exposed area of said SiON layer is nitrided. The semiconductor device has a high bonding strength between the passivation film and the semiconductor device and high moisture resistance.

4 Claims, 6 Drawing Sheets

SEMICONDUCTOR DEVICE WITH A PASSIVATION FILM

BACKGROUND OF THE INVENTION

1. Field of the Invention

The invention relates to a semiconductor device with a passivation film. More particularly, the invention relates to a semiconductor device with a passivation film provided on a surface thereof, said passivation film comprising a SiON layer in contact with the surface of said semiconductor device, and a $Si_3N_4$ layer provided at the outer side of said SiON layer.

2. Description of the Related Art

A plurality of insulating thin films are superposed as a passivation film on a surface of a semiconductor device using a substrate composed of GaAs and the like for various purposes. Prior art technologies on such a passivation film, which is background of the present invention, are disclosed in, for example, Japanese Patent Publication No. 2-8455 and Japanese Patent Laid-Open Nos. 3-225828 and 3-268430.

Japanese Patent Publication No. 2-8455 discloses a structure of a passivation film comprising laminating a plurality of $Si_3N_4$ layers on a GaAs substrate (first prior art technology). Japanese Patent Laid-Open No. 3-225828 discloses a structure of a passivation film comprising laminating a plurality of SiON layers on a GaAs substrate (second prior art technology). Japanese Patent Laid-Open No 3-268430 discloses a structure comprising a SiON inner layer beside a GaAs substrate and a $Si_3N_4$ outer layer (third prior art technology).

However, the above-mentioned first to third prior art technologies, involve the following problems.

In the first prior art technology, although the passivation film has sufficient moisture resistance because the laminated $Si_3N_4$ layer will barely be permeated by water, the passivation film will lift off during thermal cycles of an environmental test or peel off during a wire bonding process because the bonding strength between GaAs and $Si_3N_4$ is relatively low. The passivation film having a laminate structure using a $Si_3N_4$ layer therefore does not have high reliability.

The second prior art technology does not cause the above-mentioned problems, i.e., lifting and peeling because a stress-free SiON passivation film having a high bonding strength to GaAs can be readily obtained. The passivation film having a laminate structure using a SiON layer, however, does not have satisfactory moisture resistance due to high water permeability inherent in SiON and does not have high reliability in this regard.

The third prior art technology is conceivable from the above-mentioned results, in which, in a passivation film having a laminate structure, a SiON layer having a high bonding strength to GaAs is formed at the inner side beside the GaAs substrate and a $Si_3N_4$ layer having high moisture resistance is formed at the outer side. However, mere modification of the passivation film, such as the third prior art technology, does not always assure satisfactory performance as described below in detail.

Although the SiON layer formed at the inner side, beside the GaAs substrate, improves the bonding strength with GaAs, the outermost layer must be a $Si_3N_4$ layer and a structure in which the periphery of the SiON layer is exposed must be avoided since SiON has essentially inferior moisture resistance. However, the periphery of the inner SiON layer at the edge of the passivation film is unavoidably exposed during lamination of the SiON layer and the $Si_3N_4$ layer and etching of a bonding pad section or scribe line. A sample having an exposed SiON layer periphery was subjected to, for example, a PCT test at 121° C. and 85% RH for 100 hours in an unsaturated vapor atmosphere, and observed by optical microscopy. Discoloration and water penetration at the periphery of the SiON layer were observed.

Further, there are the following additional problems to be solved in the third prior art technology.

When IC is formed, for example, an etching process for making a resist pattern is extensively used because a thin film resistor is formed on the SiON layer of the semiconductor device. In this case, wet or dry etching on SiON is necessary. However, the limitations on the process conditions becomes severe because the etching rate of SiON is larger than $Si_3N_4$.

When two (a first and a second) SiON layers are formed on the GaAs substrate in order to use the second SiON layer as a material of a MIM capacitor in forming IC, the area of the capacity electrode must be larger than that formed on a $Si_3N_4$ layer because the relative dielectric constant of SiON is 5 or less while that of $Si_3N_4$ is 7 or more. This causes an increase in cost and severe process conditions for making the MIM capacitor on the second SiON layer. Even if the above severe process conditions are achieved, the thickness of the SiON layer becomes too great if the structure of the third prior art technology is applied. In view of a reliability of moisture resistance, a thin SiON layer is preferable.

SUMMARY OF THE INVENTION

It is an object of the present invention to provide a semiconductor device with a passivation film, which can solve the above-mentioned problems.

The invention provides a semiconductor device with a passivation film of the above mentioned kind, which is characterized in that the passivation film has an outermost layer of $Si_3N_4$, and the outermost layer has a portion being in contact with said semiconductor device. Said semiconductor device may have a bonding pad section formed by removing a part of said passivation film by etching, and said outermost layer covers the periphery of said bonding pad section or a scribe line.

The invention further provides a method of manufacturing the above semiconductor device, comprising the steps of 1) forming said SiON layer in contact with the surface of said semiconductor device, and 2) forming said outermost layer of $Si_3N_4$ on said SiON layer so as to be in contact with said semiconductor device.

The invention further provides a method of manufacturing the above semiconductor device, comprising the steps of 1) forming said SiON layer in contact with the surface of said semiconductor device, 2) forming said bonding pad section or said scribe line by removing a part of said SiON by etching, 3) forming said outermost layer of $Si_3N_4$ on said SiON and said bonding pad section or said scribe line, and 4) removing said outermost layer at said bonding pad section by etching so that said outermost layer at the periphery of said bonding pad section remains.

In accordance with the present invention as described above, since the portion of the passivation film in contact with the semiconductor device is composed of SiON having a high bonding strength, the bonding strength of the passivation film to the semiconductor device is increased, defects of the passivation film, such as lifting due to heat cycles and peeling during wire bonding, can be suppressed, and highly reliable semiconductive devices can be produced.

Since the passivation film has an outermost layer of $Si_3N_4$, and the outermost layer has a portion in contact with said semiconductor device, the passivation film is entirely covered with $Si_3N_4$ and has highly reliable moisture resistance. As a result, the effect of preventing penetrating water is improved.

Further, the invention provides a structure having a increased bonding strength between the semiconductor device and the passivation film with high moisture resistance, causing no limitation in the process of making an IC with introduction of a thin film resistor/MIM capacitor.

When the semiconductor device has a bonding pad section or a scribe line formed by removing a part of the passivation film by etching and the outermost layer covers the periphery of the bonding pad section and the scribe line, the SiON layer is not exposed even at the periphery of the bonding pad section and the scribe line. Thus, the penetration of water from there can be prevented.

Another aspect of the invention provides a semiconductor device with a passivation film of the above mentioned kind, which is characterized in that the exposed area of said SiON layer is nitrided.

In the above semiconductor device, the outermost layer of said passivation film may preferably be said $Si_3N_4$ layer.

In the above semiconductor device, said passivation film may have a structure consisting of a single SiON layer and a single $Si_3N_4$ layer.

In the above semiconductor device, the nitrided area of said SiON layer may be a plasma treated area by using gaseous ammonia.

The invention further provides a method of manufacturing the above semiconductor, comprising the steps of 1) forming said SiON layer in contact with the surface of said semiconductor device, 2) forming said $Si_3N_4$ layer above said SiON layer, and 3) nitriding the exposed area of said SiON layer which is not covered by said $Si_3N_4$ layer.

In accordance with the another aspect of the invention as described above, since the portion of the passivation film in contact with the semiconductor device is also composed of SiON having a high bonding strength, the bonding strength of the passivation film to the semiconductor device is increased, defects of the passivation film, such as lifting due to heat cycles and peeling during wire bonding, can be suppressed, and highly reliable semiconductive devices can be produced.

Since the passivation film is entirely covered with $Si_3N_4$, it has highly reliable moisture resistance, and it can enhance the effect of preventing penetration of water into the semiconductor device.

Also, in the present invention as described above, the compatibility of the increased bonding strength of the semiconductor device to the passivation film and the improved moisture resistance can be achieved by combining a SiON layer and a $Si_3N_4$ layer and by nitriding the exposed areas of SiON layer, without forming additional insulating layers for improving the moisture resistance. The passivation film having a laminate structure of only one SiON layer and only one $Si_3N_4$ layer is sufficiently effective for such a purpose. If such an advantage is not required, the passivation film may comprise two or more SiON layers and/or $Si_3N_4$ layers.

Since an ammonia plasma treatment of the SiON layer is capable of nitriding only the surface of the SiON layer, such an ammonia plasma treatment can be advantageously applied for nitriding the exposed peripheries of the SiON layer.

The invention will be described in detail by the following embodiments with the accompanying drawings.

PREFERRED EMBODIMENT OF THE INVENTION

1. First Embodiment

FIGS. 1 to 9 show steps for illustrating a first embodiment in accordance with the present invention and manufacturing semiconductor devices including a field effect transistor (FET) using GaAs.

Figure 1:
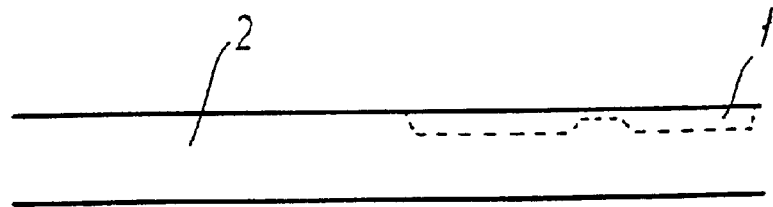
FIG. 1 is a cross-sectional view illustrating a first step which is performed for manufacturing a semiconductor device in accordance with a first embodiment of the invention.

As shown in FIG. 1, a GaAs substrate 2 provided with an activation layer 1 formed at a given region by ion implantation is prepared first.

Figure 2:
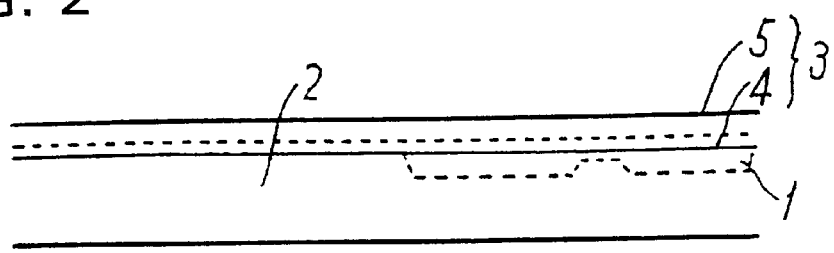
FIG. 2 is a cross-sectional view illustrating a second step which is performed for manufacturing a semiconductor device in accordance with the first embodiment of the invention.

As shown in FIG. 2, a SiON layer 4 and then a $Si_3N_4$ layer 5 as a first insulation layer 3 are formed on the entire surface of the GaAs substrate 2 by a plasma CVD process. Change from the formation of the SiON layer 4 to the formation of the $Si_3N_4$ layer 5 is achieved by changing the flow rates of material gases, for example, $SiH_4$:20 SCCM, $NH_3$:50 SCCM, $N_2O$:40 SCCM and $N_2$:200 SCCM for the SiON layer 4, and $SiH_4$:30 SCCM, $NH_3$:80 SCCM and $N_2$:200 SCCM for the $Si_3N_4$ layer 5 at a substrate temperature of 300° C. and an ambient pressure of 0.5 Torr (=66.5 Pa).

Figure 3:
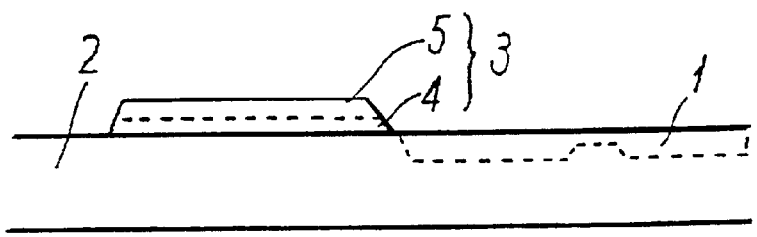
FIG. 3 is a cross-sectional view illustrating a third step which is performed for manufacturing a semiconductor device in accordance with the first embodiment of the invention.

Next, as shown in FIG. 3, a resist pattern is formed and etching is carried out to remove the insulation layer 3 at the portion that FET is to be formed.

Figure 4:
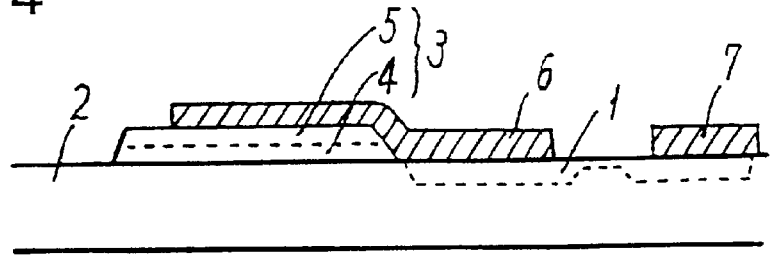
FIG. 4 is a cross-sectional view illustrating a fourth step which is performed for manufacturing a semiconductor device in accordance with the first embodiment of the invention.
Figure 5:
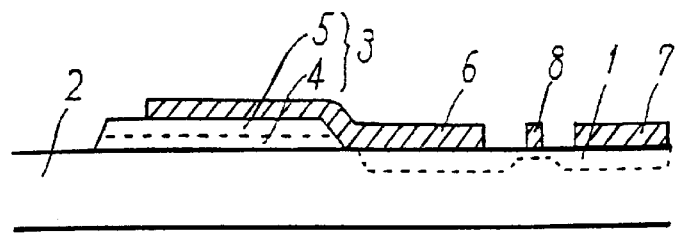
FIG. 5 is a cross-sectional view illustrating a fifth step which is performed for manufacturing a semiconductor device in accordance with the first embodiment of the invention.

Next, as shown in FIG. 4, ohmic electrodes 6 and 7 as a drain electrode and a source electrode, respectively, having a Au:Ge/Ni/Au laminate structure are formed, and as shown in FIG. 5, a gate electrode 8 having a Ti/Pt/Au laminate structure is formed. The fundamental section of the FET is completed thereby.

Figure 6:
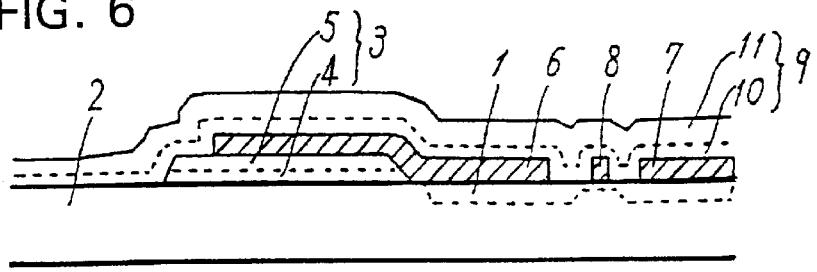
FIG. 6 is a cross-sectional view illustrating a sixth step which is performed for manufacturing a semiconductor device in accordance with the first embodiment of the invention.

Next, as shown in FIG. 6, a SiON layer 10 and then a $Si_3N_4$ layer 11 as a second insulation layer 9 are formed on the entire surface of the GaAs substrate 2 by a plasma CVD process, like the process of forming the first insulation layer 3. The thickness of the second insulation layer 9 is, for example, 2000 angstroms. The second insulation layer 9 has a laminated structure of the SiON layer 10 and the $Si_3N_4$ layer 11 in which the SiON layer 10 is in contact with the GaAs substrate 2 in the vicinity of the gate electrode 8.

Figure 7:
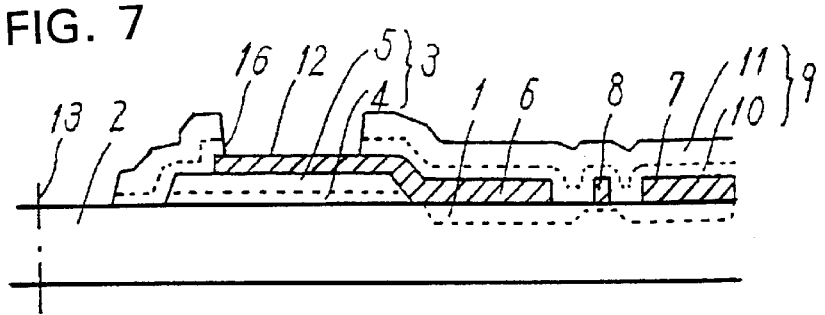
FIG. 7 is a cross-sectional view illustrating a seventh step which is performed for manufacturing a semiconductor device in accordance with the first embodiment of the invention.

Next, as shown in FIG. 7, the second insulation layer 9 is removed by etching at the sections in contact with an upper electrode layer not shown in the drawing, for example, a bonding pad section 12 of a ohmic electrode 6 and a scribe line 13 shown with an alternate long and short dash line.

Figure 8:
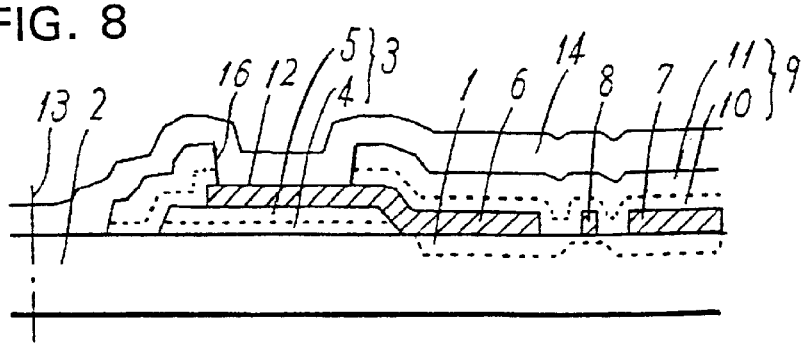
FIG. 8 is a cross-sectional view illustrating a eighth step which is performed for manufacturing a semiconductor device in accordance with the first embodiment of the invention.

Next as shown in FIG. 8, a $Si_3N_4$ layer 14 as a third insulation layer is formed on the entire surface of the GaAs substrate 2. The thickness of the $Si_3N_4$ layer 14 is, for example, 5000 angstroms.

Figure 9:
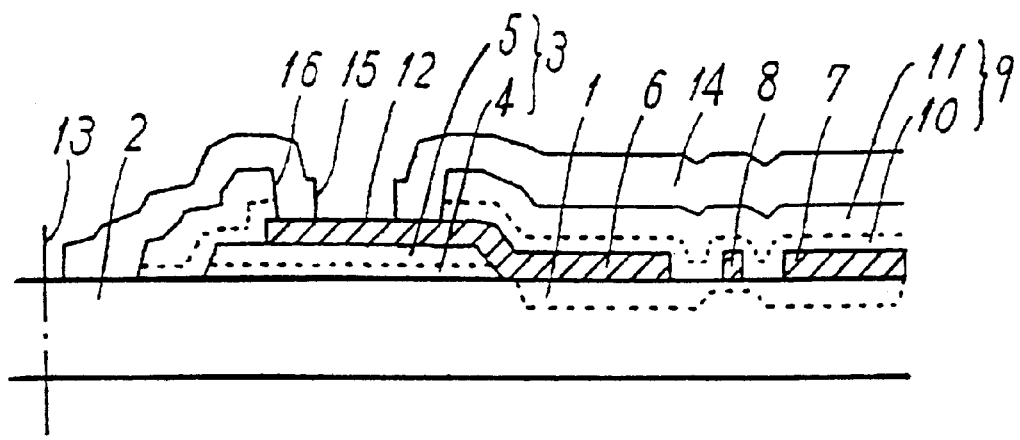
FIG. 9 is a cross-sectional view illustrating a ninth step which is performed for manufacturing a semiconductor device in accordance with the first embodiment of the invention, and illustrating a state in which an intended passivation film is formed.

Then, as shown in FIG. 9, the $Si_3N_4$ layer 14 as a third insulation layer is removed by etching at the sections to be in contact with an upper electrode layer including the above described bonding pad section 12 and the scribe line 13. The etching process is carried out after forming of a photoresist pattern, by reactive ion etching using $CHF_3$ gas or $O_2$ gas for example.

As described above, the passivation film for the semiconductor device shown in the drawings is obtained having the laminated structure of the first insulation layer 3 (the SiON layer 4 and the $Si_3N_4$ layer 5), the second insulation layer 9 (the SiON layer 10 and the $Si_3N_4$ layer 11), and the third insulation layer 14 (the $Si_3N_4$ layer 14).

Figure 10:
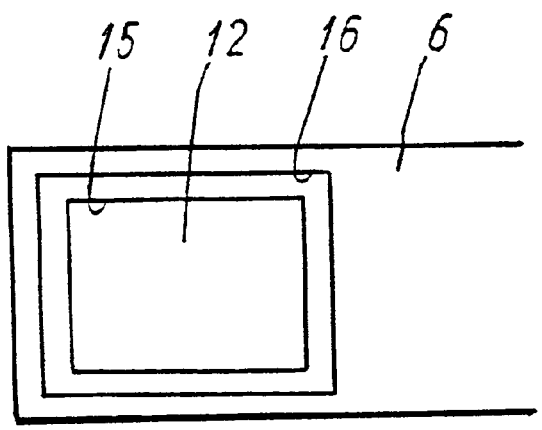
FIG. 10 is a schematic plan view showing the scale relation between the opening 15 of the $Si_3N_4$ layer 14 and the opening 16 of the second insulation layer 9, in FIG. 9.

Focusing attention on the bonding pad section 12, the periphery of the bonding pad section 12 is covered by the outermost $Si_3N_4$ layer 14. As shown in FIG. 10, an opening 15 formed at the $Si_3N_4$ layer 14 in the process shown in FIG. 9 is set to be smaller than an opening 16 formed at the second insulation layer 9 in the etching process of FIG. 7. For example, the opening 15 is set to be 3 micrometers smaller than the opening 16. In this manner, the $Si_3N_4$ layer 14 covers the periphery of the opening 16 at the SiON layer 10 and the $Si_3N_4$ layer 11 included in the second insulation layer 9, placed below the $Si_3N_4$ layer 14.

According to the first embodiment, a high bonding strength between the passivation film and the GaAs substrate 2 can be obtained because the SiON layer 4 or 10 of the passivation film is in contact with the GaAs substrate 2. This is proved by experimental results that SiON has a bonding strength as approximately twice that of $Si_3N_4$ in a scratch test and by the fact that nitrides of Ga and As never form when heating GaAs in air although oxides of Ga and As form.

Also, the $Si_3N_4$ layer 5 and 11 is at the outer side in the first and second insulation layer 3 and 9, and the third insulation layer is the $Si_3N_4$ layer 14. Since the etching rate of the $Si_3N_4$ layers is small compared with SiON layers, a pattern of a thin metal film resistor is readily formed on each of the $Si_3N_4$ layers 5, 11 and 14 by using an etching process.

When each of the first and second insulation layers 3 and 9 is used as a MIM capacitor of IC, a capacity decrease accordingly causes no problem by making the SiON layer 4 or 10 thin in the $SiON/Si_3N_4$ structure. In this matter, making the SiON layer 4 or 10 to be thin is preferable and causes no problem in view of the subject matter of the invention.

Further, the semiconductor device including the GaAs substrate 2 is covered by the outermost $Si_3N_4$ layer 14 on the entire surface thereof. Since the $Si_3N_4$ layer 14 is highly reliable in moisture resistance, the effect of preventing penetration of water to the semiconductor device can be improved.

Also at the periphery of the bonding pad section 12, the second insulation layer 9 having the laminated structure of SiON 10 and $Si_3N_4$ layer 11 is not exposed and is covered entirely by the $Si_3N_4$ layer 14. Therefore, the penetration of water from the periphery of the bonding pad section 12 can also be avoided by the $Si_3N_4$ layer 14, improving the reliability of the semiconductor device.

In this embodiment, the GaAs substrate 2 is used as a semiconductor substrate. However, it is noted that the invention is applicable to a semiconductor device comprising a substrate made of the other material.

2. Second Embodiment

FIGS. 11 to 16 show steps for illustrating an embodiment in accordance with the present invention and manufacturing semiconductor devices including a field effect transistor (FET) using GaAs.

Figure 11:
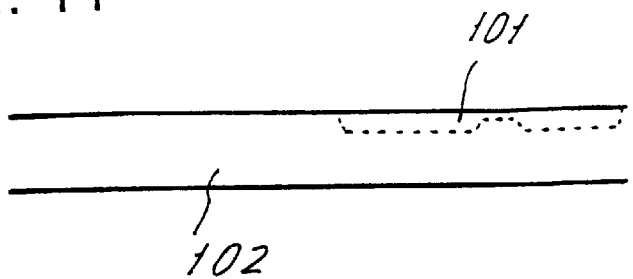
FIG. 11 is a cross-sectional view illustrating a first step which is performed for manufacturing a semiconductor device in accordance with the second embodiment of the invention.
Figure 12:
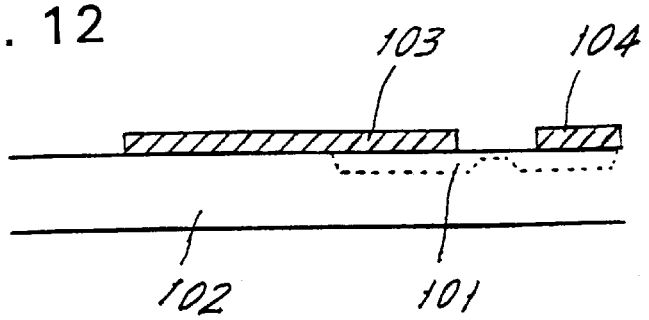
FIG. 12 is a cross-sectional view illustrating a second step which is performed for manufacturing a semiconductor device in accordance with the second embodiment of the invention.
Figure 13:
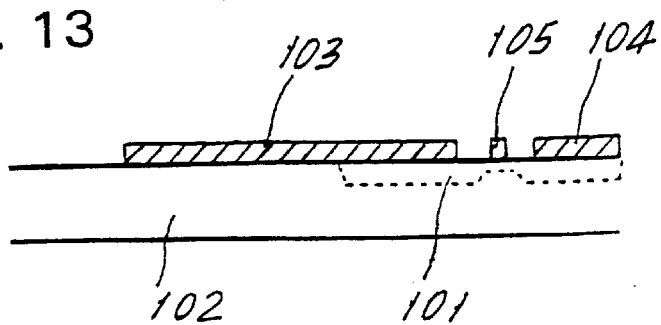
FIG. 13 is a cross-sectional view illustrating a third step which is performed for manufacturing a semiconductor device in accordance with the second embodiment of the invention.

As shown in FIG. 11, a GaAs substrate 102 provided with an activation layer 101 formed at a given region by ion implantation is prepared first. Next, as shown in FIG. 12, ohmic electrodes 103 and 104 as a drain electrode and a source electrode having a Au:Ge/Ni/Au laminate structure are formed, and as shown in FIG. 13, a gate electrode 105 having a Ti/Pt/Au laminate structure is formed. The fundamental section of the FET is completed thereby.

Figure 14:
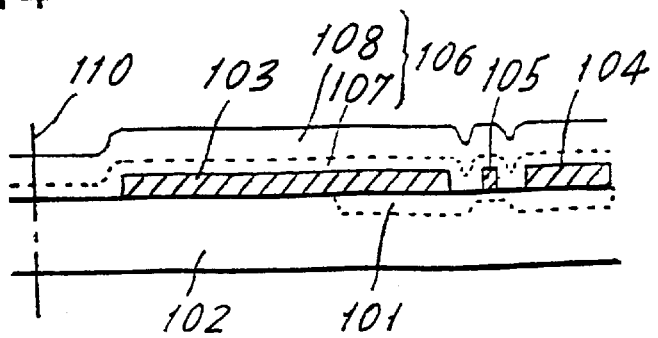
FIG. 14 is a cross-sectional view illustrating a fourth step which is performed for manufacturing a semiconductor device in accordance with the second embodiment of the invention.

As shown in FIG. 14, a SiON layer 107 and then a $Si_3N_4$ layer 108 as a protective film 106 are formed on the entire surface of the GaAs substrate 102 by a plasma CVD process. Change from the formation of the SiON layer 107 to the formation of the $Si_3N_4$ layer is achieved by changing the flow rates of material gases, for example, $SiH_4$:20 SCCM, $NH_3$:50 SCCM, $N_2O$:40 SCCM and $N_2$:200 SCCM for the SiON layer 107, and $SiH_4$:30 SCCM, $NH_3$:80 SCCM and $N_2$:200 SCCM for the $Si_3N_4$ layer 108 at a substrate temperature of 300° C. and an ambient pressure of 0.5 Torr (=66.5 Pa).

Figure 15:
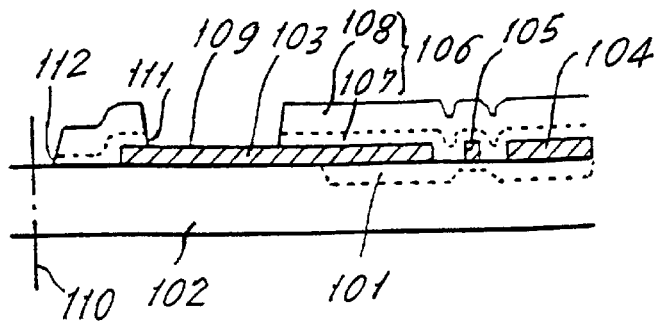
FIG. 15 is a cross-sectional view illustrating a fifth step which is performed for manufacturing a semiconductor device in accordance with the second embodiment of the invention.

As shown in FIG. 15, the passivation film 106 is removed by etching at the sections to be in contact with an upper electrode layer not shown in the drawing, for example, a bonding pad section 109 of a ohmic electrode 103 or a scribe line 110 shown as an alternate long and short dash line. The processing on the surface of the GaAs substrate 102 is completed in this step, and the peripheries 111 and 112 of the inner SiON layer 107 are exposed at the edges of the passivation film 106 as shown in FIG. 15.

A plasma treatment using an ammonia/hydrogen gaseous mixture is performed in order to improve the moisture resistance of the peripheries 111 and 112 of the SiON layer 107. The plasma treatment is performed, for example, at a temperature of 350° C. of the substrate 102, a pressure of 0.6 Torr (79.8 Pa), an RF power of 350 W, a $NH_3$ flow rate of 80 SCCM, and an $H_2$ flow rate of 200 SCCM, for 30 minutes in a plasma CVD system.

Figure 16:
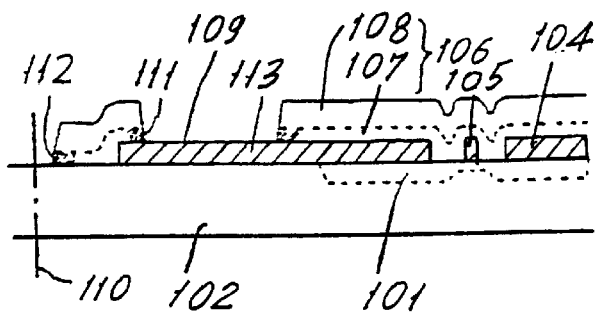
FIG. 16 is a cross-sectional view illustrating a sixth step which is performed for manufacturing a semiconductor device in accordance with the second embodiment of the invention, and illustrating a state in which an intended passivation film is formed.

The peripheries 111 and 112 of the SiON layer 107 are nitrided by the plasma treatment, as shown by shaded portions in FIG. 16. As a result, the entire surface, exposed to the open air, of the passivation film 106 is covered with $Si_3N_4$, which is highly reliable in moisture resistance.

The present inventors have discovered that the surface of the SiON film can be nitrided by selecting moderate conditions in the SiON plasma nitriding process.

Figure 17:
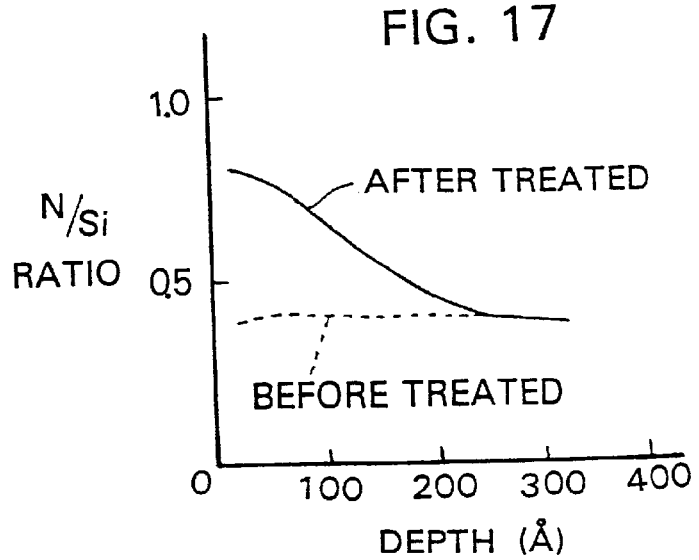
FIG. 17 is a graph illustrating the change in the N/Si ratio of a SiON film after plasma treatment compared to the N/Si ratio of the SiON film before plasma treatment, which are analyzed by photoelectron spectroscopy.
Figure 18:
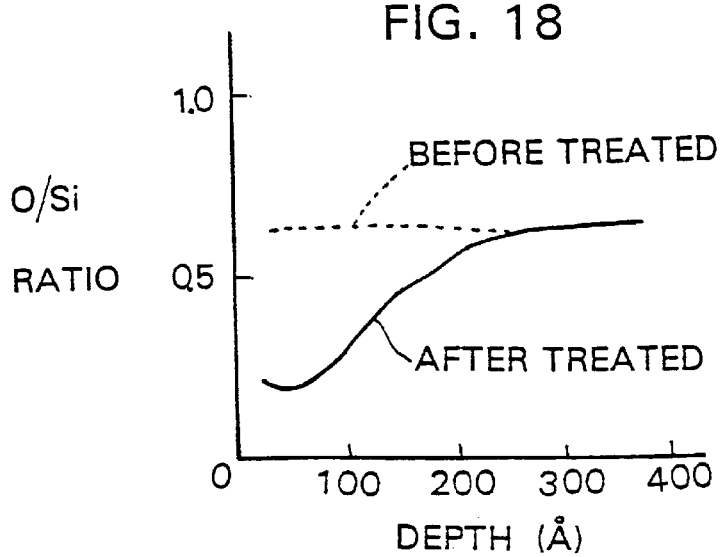
FIG. 18 is a graph illustrating the change in the O/Si ratio of a SiON film after plasma treatment compared to the O/Si ratio of the SiON film before plasma treatment, which are analyzed by photoelectron spectroscopy.

FIGS. 17 and 18 are graphs illustrating change in the composition of the SiON film between before and after the plasma treatment which is determined by photoelectron spectroscopy, wherein each horizontal axis represents the depth from the surface of the SiON film and each vertical axis represents the N/Si ratio in the SiON film in FIG. 7 and the O/Si ratio in the SiON film in FIG. 18. FIGS. 17 and 18 demonstrate that the SiON film is nitrided from the surface to near 200 angstroms.

According to the above-mentioned embodiment, the bonding strength of the passivation film 106 to the GaAs substrate 102 can be increased since the SiON layer 107 included in the passivation film 106 comes into contact with the GaAs substrate 102. This is proved by experimental results that SiON has a bonding strength of approximately twice that of $Si_3N_4$ in a scratch test and by the fact that nitrides of Ga and As never form when heating GaAs in air although oxides of Ga and As form.

Since the passivation film 106 has a $Si_3N_4$ layer 108 at the outer side and the exposed peripheries 111 and 112 of the inner SiON layer 107 are nitrided, penetration of water from the surface can be effectively inhibited and thus change in semiconductor device characteristics due to water penetration can be suppressed.

Figure 19:
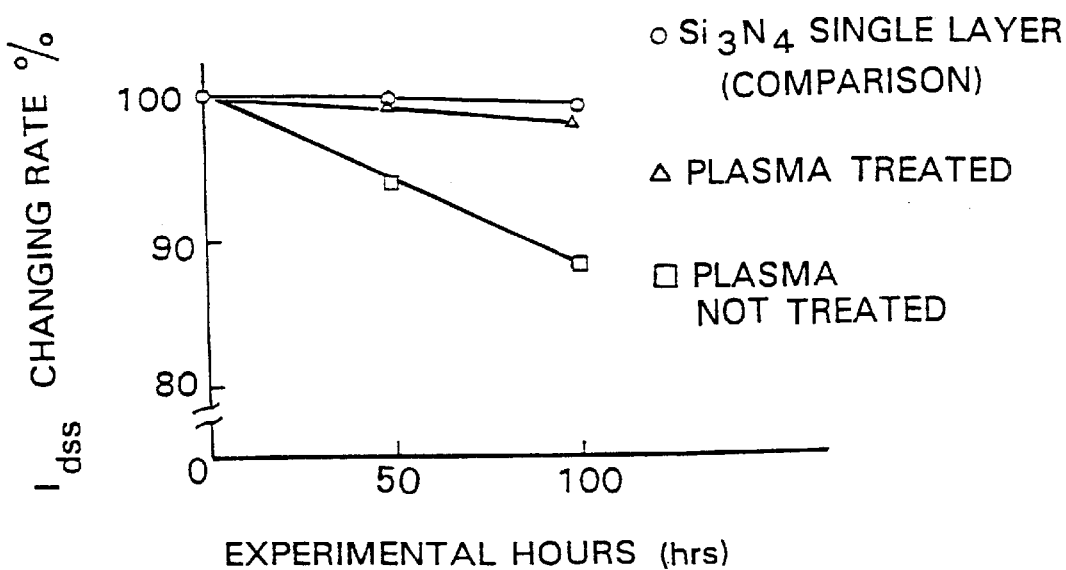
FIG. 19 is a graph illustrating the change rates of saturation drain currents ($I_{dss}$) of a plasma-treated passivation film in accordance with a first embodiment of the invention, a untreated passivation film and a passivation film comprising a $Si_3N_4$ monolayer for comparison.

In terms of this embodiment, a GaAs MESFET sample was subjected to a PCT test to determine an average change rate of saturation drain current ($I_{dss}$). The results are shown in FIG. 19. FIG. 19 includes $I_{dss}$ change rates of a plasma-treated passivation film (thickness of the SiON layer: 300 angstroms, and thickness of the $Si_3N_4$ layer: 1,200 angstroms) in accordance with a specific embodiment of the present invention, a non-treated passivation film, and a passivation film comprising a $Si_3N_4$ monolayer having a thickness of 1,500 angstroms for comparison.

As shown in FIG. 19, the $I_{dss}$ change rate of the plasma-treated passivation film can be significantly decreased compared to that of the non-treated passivation film although it is 1 to 2% greater than that of the passivation film having the $Si_3N_4$ monolayer. These results demonstrate that a highly reliable semiconductor device can be obtained in the present invention.

The invention is applicable to chip semiconductor devices, such as GaAs MESFETs and MMICs, which are used as active devices for microwave and quasi-microwave communication devices. The invention is also applicable to Si-semiconductor devices. Further, the present invention is not limited to the semiconductor devices such as FET and is also applicable to other active devices.

What is claimed is:

1. A semiconductor device with a laminated passivation film, comprising:

a semiconductor substrate having a semiconductor device at a portion of a surface thereof, the semiconductor device having an electrode on the semiconductor substrate,; and a laminated passivation film on a surface of the semiconductor substrate covering the semiconductor device, the laminated passivation film including an innermost insulation layer of SiON which covers the entire of the semiconductor device and is in contact with the surface of the semiconductor substrate and an outermost insulation layer of $Si_3N_4$ which covers the innermost insulation layer entirely such that no portion of the innermost insulation layer is exposed and said outermost layer in contact with the surface of the semiconductor substrate wherein the laminated passivation film has an opening which exposes a portion of the electrode and the outermost insulation layer is in contact with the electrode at a periphery of the opening.

2. The semiconductor device with a laminated passivation film according to claim 1, wherein the semiconductor substrate comprises GaAs.

3. The semiconductor device with a laminated passivation film according to claim 2, wherein the semiconductor device is a FET.

4. The semiconductor device with a laminated passivation film according to claim 3, wherein the semiconductor device is a MESFET.

* * * * *